United States Patent
Wang et al.

(10) Patent No.: US 7,960,653 B2
(45) Date of Patent: Jun. 14, 2011

(54) CONDUCTIVE NANOWIRES FOR ELECTRICAL INTERCONNECT

(75) Inventors: Shih-Yuan Wang, Palo Alto, CA (US); Sagi Mathai, Palo Alto, CA (US); Wei Wu, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 109 days.

(21) Appl. No.: 12/259,997

(22) Filed: Oct. 28, 2008

(65) Prior Publication Data

US 2010/0018747 A1  Jan. 28, 2010

Related U.S. Application Data

(60) Provisional application No. 61/083,587, filed on Jul. 25, 2008.

(51) Int. Cl.
*H01R 4/00* (2006.01)
(52) U.S. Cl. .................... 174/94 R; 174/126.2
(58) Field of Classification Search ............... 174/94 R, 174/126.2
See application file for complete search history.

(56) References Cited

U.S. PATENT DOCUMENTS

| | | | |
|---|---|---|---|
| 6,297,063 B1 * | 10/2001 | Brown et al. | 438/2 |
| 6,987,027 B2 * | 1/2006 | Jin | 438/20 |
| 7,039,619 B2 | 5/2006 | Nugent | |
| 7,211,464 B2 | 5/2007 | Lieber et al. | |
| 7,265,575 B2 | 9/2007 | Bertin | |
| 7,301,199 B2 | 11/2007 | Lieber et al. | |
| 7,332,736 B2 * | 2/2008 | Jin | 257/10 |
| 2004/0026681 A1 | 2/2004 | Cruchon-Dupeyrat et al. | |
| 2004/0039717 A1 | 2/2004 | Nugent | |
| 2004/0213307 A1 | 10/2004 | Lieber et al. | |
| 2004/0239210 A1 | 12/2004 | Pinkerton et al. | |
| 2005/0224975 A1 * | 10/2005 | Basavanhally et al. | 257/741 |
| 2007/0111503 A1 * | 5/2007 | Jeon et al. | 438/618 |

FOREIGN PATENT DOCUMENTS

| | | |
|---|---|---|
| WO | 2006123049 A2 | 11/2006 |
| WO | 2007145701 A2 | 12/2007 |

* cited by examiner

*Primary Examiner* — Chau N Nguyen

(57) ABSTRACT

An electrical interconnect includes first and second electrical contacts to be electrically connected, each electrical contact having a plurality of electrically conductive nanowires extending outwardly from a respective electrical contact; and the nanowires of the first electrical contact configured to mesh with the nanowires of the second electrical contact such that an electrical connection is established between the first electrical contact and the second electrical contact. A method for interconnecting electrical contacts includes meshing a first array of electrically conductive nanowires extending from a first electrical contact with a second array of electrically conductive nanowires extending from a second electrical contact so as to establish an electrical connection between said first and second electrical contacts.

20 Claims, 5 Drawing Sheets

CONDUCTIVE NANOWIRES FOR ELECTRICAL INTERCONNECT

CROSS-REFERENCE TO RELATED APPLICATION

The present application claims priority from provisional application Ser. No. 61/083,587, filed Jul. 25, 2008, the contents of which are incorporated herein by reference in their entirety

BACKGROUND

Modern electrical systems frequently incorporate any number of integrated circuits and other electrical components. In such systems, methods of interconnecting the separate circuits or components are needed such that an electrical connection and communication is established between the circuits or components.

However, such electrical connections are increasingly limiting the performance of electrical systems and integrated circuit design as such systems are continuously scaled down in size. Problems that arise with interconnecting separate electrical circuits or components include making contacts and connection data paths of suitable size such that the interconnection has desirable electrical characteristics, such as low resistance In some system, proximity contacts are used to provide a connection between circuits or electrical components. However, proximity contacts generally experience increased contact resistance as time passes. High contact resistance can interfere with communication between the individual system components and may result in decreased performance or increased heat production. High contact resistance may also decrease the signal-to-noise ratio of a system and may eventually cause the failure of electrical equipment.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
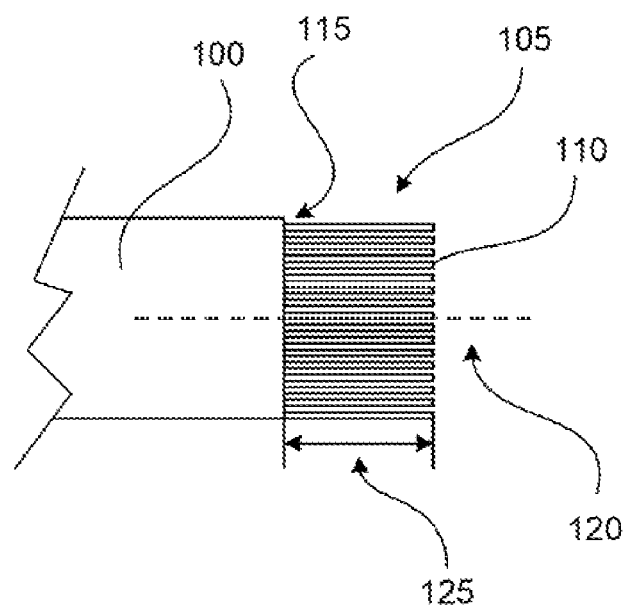
FIG. 1 is a side diagram of an exemplary electrical contact according to an embodiment of the principles described herein.

The present specification relates to the use of nanowires to form proximity contacts and electrical interconnects that provide a more reliable connection between individual circuits or components in electrical systems. For example, such electrical interconnects may be used to electrically connect individual circuit boards, integrated circuitry to a circuit board, or other individual electrical systems to each other. In various embodiments, each of two different electrical contact points is provided with an array of nanowires that extend from the contact point. When the two arrays of nanowires are physically meshed together, a reliable electrical interconnection can be formed between the contact points.

In a particular application, proximity contacts and electrical interconnects made using nanowires may be advantageously employed to connect components of a computer server, such as server blades. In a blade server, the individual blades may be frequently swapped. This may cause the electrical interconnects between individual server blades and the server infrastructure to degrade, for example, by developing higher contact resistance. Because server blades may be changed so frequently, better proximity contacts with lower resistance and which are easily connected and disconnected are desirable. Improved proximity contacts may reduce contact resistance and improve transmission efficiency and overall performance of the server system.

In another application, chip interconnects generally use solder points to connect integrated chip circuits or other components to chip carriers or circuit boards. These solder points can put stress on the chip or circuit board. For example, solder requires high heat to create a good, solid connection, which may possibly cause damage to other components or weaken a circuit board. Solder points also make it difficult to insert and remove components repeatedly without altering the contact resistance or otherwise causing detrimental effects to the wires, components, or circuit board. Consequently, as will be explained below, proximity contacts and electrical interconnects employing nanowires can be used to avoid these issues.

As used in the present specification and in the appended claims, the term "electrical interconnect" refers broadly to a physical interface that links portions of an electrical pathway along which an electrical current is propagating to another electrical pathway. Electrical interconnects may be used in purely electrical systems or may be used in electrical systems combined with optical elements.

As used in the present specification and in the appended claims, the term "nanowire" refers to a wire having dimensions in the scale of nanometers, generally with a width or lateral size as small as less than 800 nanometers and an unconstrained length, such that the length to width ratio may be greater than 2 to 10. As will be described herein, nanowires can be used in applications requiring signal transmission in electrical systems and integrated circuitry through small areas or for supplying electrical power.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "a example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As described herein, electrically conductive nanowires can be used in electrical interconnects. These interconnects may include nanowires extending from inside, or from an exterior of a surface, of a first electrical contact to a surface of a second electrical contact. However, such a configuration may have too few contact points to create a good connection with low resistance.

Contact resistance may result from electrical leads and connections rather than from the inherent characteristics of the materials used in electrical interconnects. Contact resistance is inversely proportional to the contact area between contact surfaces. Therefore, a small contact surface area results in a high contact resistance, and a large contact surface area results in a small contact resistance.

Because of the small diameter of each electrically conductive nanowire, and because the electrical connection occurs only between the ends of the nanowires and the surface of the second electrical contact, a small overall area of contact is created, which may result in a high contact resistance. Also, the formation of oxides or other poorly conducting reaction products may result in a higher contact resistance over time. Oxides may form as electrical interconnects are disconnected and reconnected many times. Consequently, non-reactive materials for fabrication of the nanowires and/or the electrical contacts can provide advantages, FIG. 1 shows an electrical contact (100) having an array (105) of electrically conductive nanowires (110) extending outward from the contact (100). The nanowires (110) may extend from a planar surface (115) of the electrical contact (100). While in the present specification, the nanowires are shown as being aligned in a particular configuration, e.g., in parallel, the nanowires may be aligned in other orientations and even random orientations relative to each other.

The nanowires (110) may be fabricated from an electrically conductive material with a low resistance, and may include low resistance metals; carbon nanotubes, silicides, semiconductors, semiconductors conformably coated with metal such as nickel, platinum, gold, or other conductive metals, or any other low resistant, electrically conductive materials known in the art that have the desired electrical and physical properties for efficiently and effectively conducting electricity through the electrical interconnect.

Semiconductor materials such as silicon may be used for the nanowires, though they may also be coated with a metal having low resistance and which does not form oxides that interfere with contact resistance. Metals such as gold, platinum, and nickel have desirable electrical properties for such a purpose. The coatings may be deposited on the nanowires by sputtering or other methods.

The nanowires (110) may be made of the same material as the electrical contact (100). Alternatively, the nanowires may be made of a different material from the electrical contact.

As will be described below with respect to FIG. 2, opposing arrays of nanowires can be meshed to form an electrical connection. Mating nanowires may be made or coated with different materials in order to avoid sticking issues. For example, nanowires from one connector/surface may be coated with nickel, and nanowires from the opposing connector/surface may be coated with platinum. Or in cases where sticking is desired, mating nanowires may be made with similar or like materials.

The nanowires (110) may be produced by etching down into a layer of electrically conductive material with a mask designed to create a plurality of nanowires (110) extending from the surface (115). Any remaining material surrounding the formed nanowires (110) may then be etched away such that the nanowires (110) are exposed and extend away from the surface (115). Other methods known in the art of fabricating the nanowires (110) in such a manner may be used.

In various embodiments, the nanowires (110) of each array may have a length (125), for example, from 1 micron to 100 microns. Any length of nanowire may be used that allows the nanowires to mesh or come in contact effectively with nanowires of an opposing array to form an electrical connection.

The array (105) may have a large or small density of nanowires (110) as required or desirable for each specific application in which the electrical interconnect is to be used. The nanowire (110) density may be as large as $10^8$ to $10^{14}$ nanowires (110) in an area of a square centimeter on the surface (115) of the electrical contact (100). The nanowire (110) density may also be as low as thousands or even hundreds of nanowires (110) per square centimeter area. For ease of illustration, the figures show a relatively small number of nanowires on each contact surface. However, it will be understood that any nanowire density may be used as best suits a particular application.

The nanowires (110) may have any Width as will establish good contact with other nanowires in the nanowire mesh. In various embodiments, the nanowires (110) have dimensions larger than 60 nanometers in order to avoid adverse electrical properties or quantum physical phenomena, such as tunneling, which may interfere with the normal operation of the electrical interconnect.

Some types of nanowires (110), such as carbon nanotubes, have unique electrical properties and high mechanical strength, as well as flexible physical properties, which allow them to be used in many different applications. A strong, flexible physical structure may be useful in applications involving electrical interconnects because strong nanowires may be resistant to damage due to vibrations or other movements. Carbon nanotubes are also efficient conductors of heat, which may be particularly useful in circuits or systems using high amounts of current or otherwise generating large amounts of heat. The carbon nanotubes may be single-walled nanotubes or multi-walled nanotubes, depending on the electrical characteristics desired for operation. Also, a carbon nanotube may be categorized as either a metal or a semiconductor, based on its molecular structure, which affects it electrical properties. Carbon nanotubes may be created by a variety of methods, one exemplary method being chemical vapor deposition on a wafer.

Silicides may also be used to form the nanowires. Silicides have a higher degree of electropositivity than carbon, meaning that silicides have a greater ability to donate electrons than carbon. Consequently, silicides are able to more closely approximate the characteristics of metallic elements in that respect than carbon.

Silicon atoms in silicides can have several different organizations, depending on other materials making up the silicides and the grouping of silicon atoms or molecules. Examples of possible silicides include isolated silicon atoms in conductive molecules, silicon pairs, silicon chains, or other electrically conductive silicides known in the art. Silicides may be combined with other elements such as titanium or tungsten for better conduction, which may allow the nanowires (110) to be used without a metal coating while still exhibiting advantageous electrical properties such as very low resistance.

In the current embodiment, the nanowires (110) are parallel to a normal (120) of the planar surface (115). However, in other embodiments, the nanowires may be at any angle or even randomly oriented to allow interconnection and good electrical contact with other nanowires (110) from another electrical contact.

Figure 2:
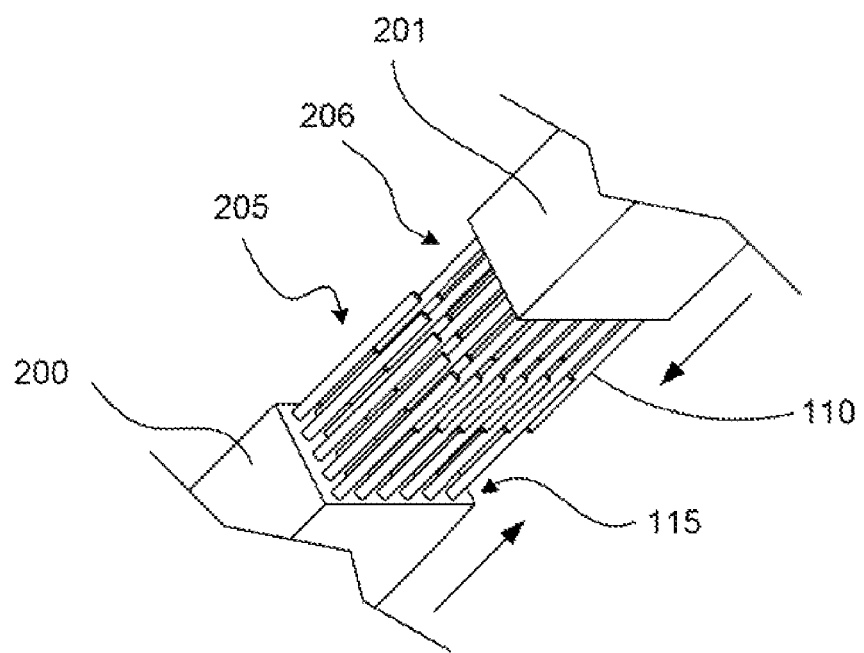
FIG. 2 is a perspective diagram of an exemplary electrical interconnect, according to an embodiment of the principles described herein.

FIG. 2 shows first and second electrical contacts (200, 201) in the process of interconnecting in order to establish an electrical connection. Each of the first and second electrical contacts (200, 201) has an array (205, 206) of nanowires (110) extending from a planar or non planar surface (115) of each electrical contact (200, 201).

A first array (205) of nanowires (110) extending from the first electrical contact (200) includes a plurality of nanowires (110) that may be evenly, non-evenly, or even randomly spaced across the surface (115) of the first electrical contact (200). Similarly a second array (206) of nanowires (110) extending from the second electrical contact (201) includes a plurality of nanowires (110) that may be evenly, non-evenly, or randomly spaced across the surface (115) of the second electrical contact (201).

The nanowires (110) of the first array (205) may be equal or non-equal in diameter and length (125) to the nanowires (110) of the second array (206). The spacing of the nanowires (110) is also such that as the first and second electrical contacts (200, 201) are brought closer together, the first and second arrays (205, 206) of nanowires (110) mesh or come in close contact. As the first and second arrays (205, 206) of nanowires (110) mesh together, the nanowires (110) from the first array (205) come in physical contact with the nanowires (110) of the second array (206).

The illustrated nanowires (110) are attached only to a respective surface (e.g. 115) of the contact and extend from that surface (115) without being connected to any other surface. Consequently, when meshed with another nanowire array, points of physical and electrical contact may occur along the lengths of the opposing nanowires as well as at the ends of the nanowires. In some cases, the ends of the nanowires may make contact with an opposing surface supporting the opposing array of nanowires.

Therefore, because of the many nanowires (110) extending from each electrical contact (205, 206), a higher amount of contacting surface area is created by the nanowires (110) touching each other along the length (125) of each nanowire than connecting a pair of contacts by only touching the ends of an array of nanowires to a surface of an electrical contact.

Because contact resistance is inversely proportional to the contacting surface area between contacts, the nanowire mesh decreases the total contact resistance by providing more contacting surface area. The nanowire mesh allows for a much higher amount of overall contact surface area than if the planar surfaces of first and second electrical contacts were brought into contact with each other directly, or if an array of nanowires extending from the first electrical contact were brought in contact with a surface of the second electrical contact.

Most of the contact occurs between the nanowires (110), though some contact may occur between the ends of the nanowires (110) and the surface (115). The electrical interconnect in the current specification is ideal for data connections and may be used for low data rates or data rates as high as up to 10 GHz or more. The electrical interconnect may also be suitable for small amounts of power transfer. In addition to being good for high speed connections, the nanowire connection may also experience a lower failure rate than electrical interconnects of the prior art because the contacts have less contact resistance.

Nanowires from arrays of opposing electrical contacts, such as the first and second electrical contacts (200, 201) of FIG. 2, may experience some sticking if the nanowires of the opposing arrays are made of the same material. The sticking may be caused by the nanowires chemically bonding, or otherwise physically bonding, to each other when nanowires made of the same or similar elements are in contact with each other for an extended period of time. The sticking may cause damage to the nanowires or electrical interconnects if the electrical contacts are separated.

In order to prevent this sticking, the nanowires of opposing arrays may be made of, or coated with, different materials. However, the different materials may be matched with respect to, or have substantially equal, electrical properties. One exemplary embodiment may include nanowires of a first array coated with gold and nanowires of a second array coated with platinum. This may allow the contacts to be readily separated from each other and later reconnected with each other or with contacts of other electrical systems, components, or integrated circuits.

If the nanowires are made of a strong, flexible material, the electrical contacts may be separated from each other many times without causing excessive stress on the contacts or on a chip board or other hardware to which the contacts are connected. This is particularly useful in server blades because the server blades are often disconnected and reconnected manually, and flexible nanowires may prevent damage to the connections.

In some embodiments, the electrical contacts may be magnetically coupled together. A magnetically coupled electrical interconnect may establish a good connection between the electrical contacts while still allowing for quick and easy removal of a server blade or other circuitry without deteriorating the nanowires or contacts due to their being pulled apart many times. It also may help align the nanowire arrays of the server blade with a nanowire array of a server tower such that installation of the server blade in the server tower is simple and fast.

Alternative methods of establishing a good connection between the nanowire arrays may be employed, such as applying pressure to the contacts or otherwise compressing the contacts such that the nanowires are meshed and held together. Other methods may also be used.

The spacing between each of the nanowires (110) in both the first and second arrays (205, 206) may be such that each of the nanowires (110) of the first array (205) is in contact with a plurality of nanowires (110) from the second array (206) in any manner. Ideally, the nanowires (110) are arranged in a manner that allows the nanowires (110) to be meshed without damaging or exerting excessive physical stress on any of the nanowires (110). Some physical stress may be applied to the nanowires (110) to provide a better grip or connection between the first and second arrays (205, 206) of nanowires (110).

Figure 3:
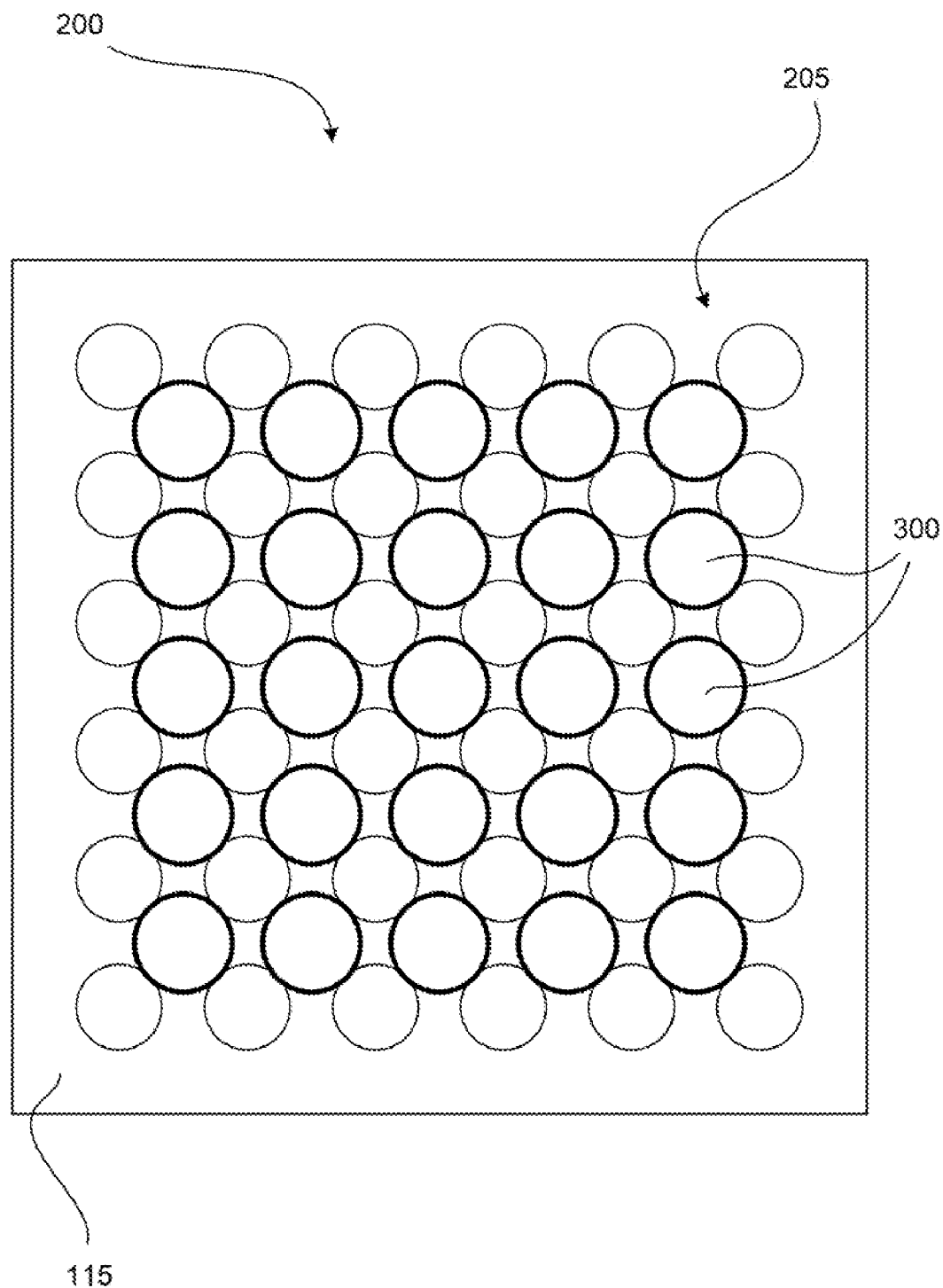
FIG. 3 is an orthogonal diagram of an exemplary electrical contact having a plurality of electrically conductive nanowires, according to an embodiment of the principles described herein.

FIG. 3 shows a view of a planar surface (115) of a first electrical contact (200) having a first array (205) of nanowires. The surface (115) may also include inset regions (300), such as indentations or dips, for receiving the tips of a second array of nanowires from a second electrical contact. The inset regions (300) have a slightly larger diameter than the nanowires of the second array so that ends of the nanowires of the second array are able to be inserted into the inset regions (300).

The surface (115) of the electrical contact (200) may be made from a highly conductive, low resistance material. Alternatively, a layer of highly conductive, low resistance material may be deposited in the inset regions (300) in order to reduce contact resistance between ends of the nanowires and the surface (115) of the electrical contact (200). The nanowires of the second array may have a different diameter than the nanowires of the first array (205).

Figure 4:
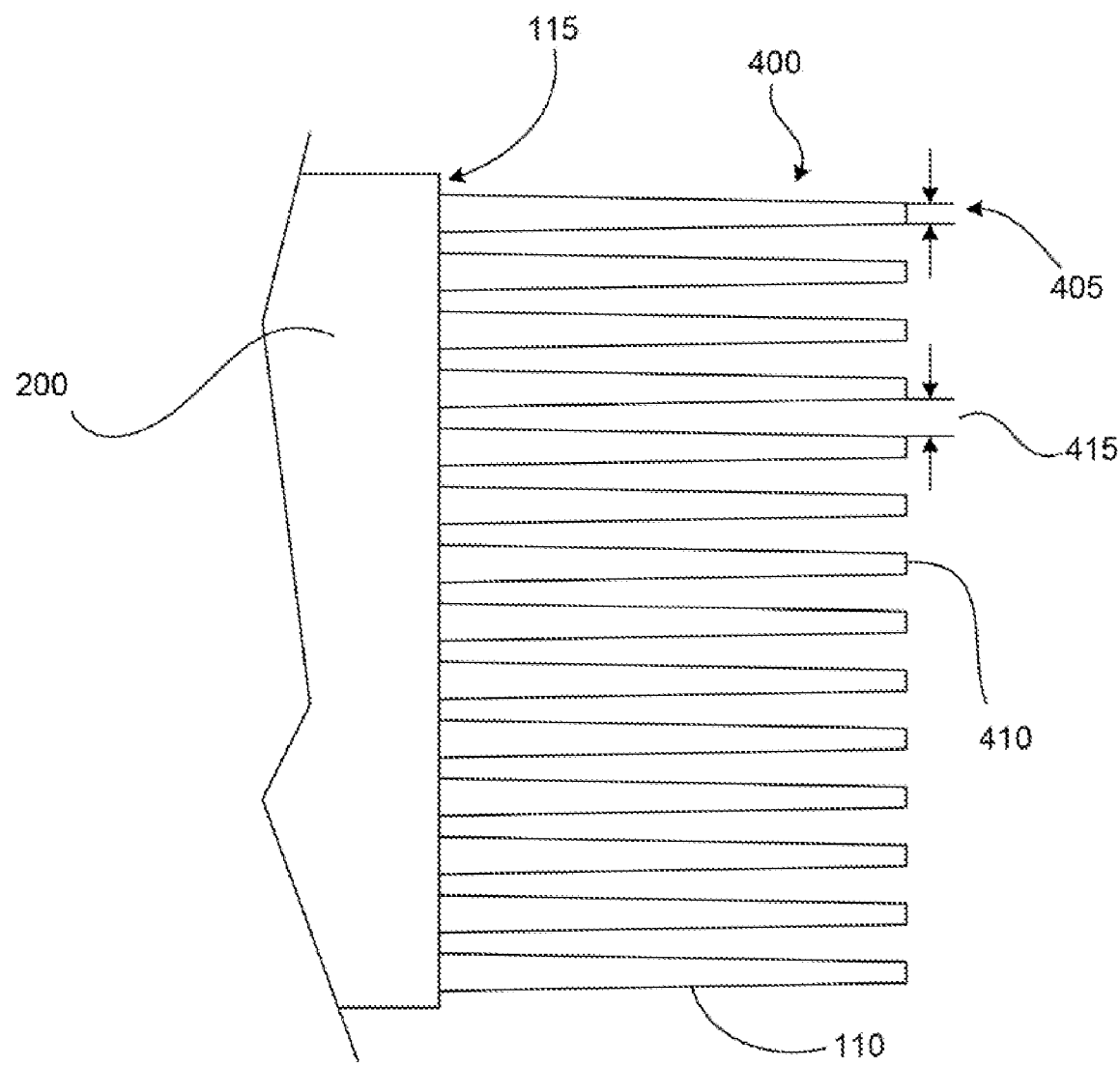
FIG. 4 is a side diagram of an exemplary electrical contact having a plurality of conductive nanowires, according to an embodiment of the principles described herein.

FIG. 4 shows an illustrative embodiment of an array (400) of nanowires (110). As shown in the example of FIG. 4, the nanowires (110) may have a varied width (405) from the surface (115) of the electrical contact (200) to the ends of the nanowires (110). The varied width (405) may include a taper at one end (410) of each of the nanowires (110), as in the current embodiment. The varied width (405) may be determined during fabrication by adjusting the etching time or other steps in the fabrication process or by other methods after deposition and etching.

The varied width (405) in the nanowires (110) may allow first and second arrays of nanowires to mesh together tighter according to the size and taper of each array of nanowires. If the nanowires in the second array are larger in diameter or width than the spacings (415) between each nanowire in the first array, the nanowires may place some or all of the nanowires (110) in a state of radial or lateral compression. Consequently, this may allow the nanowires to form a tighter mesh as the electrical contacts are brought closer together.

Figure 5:
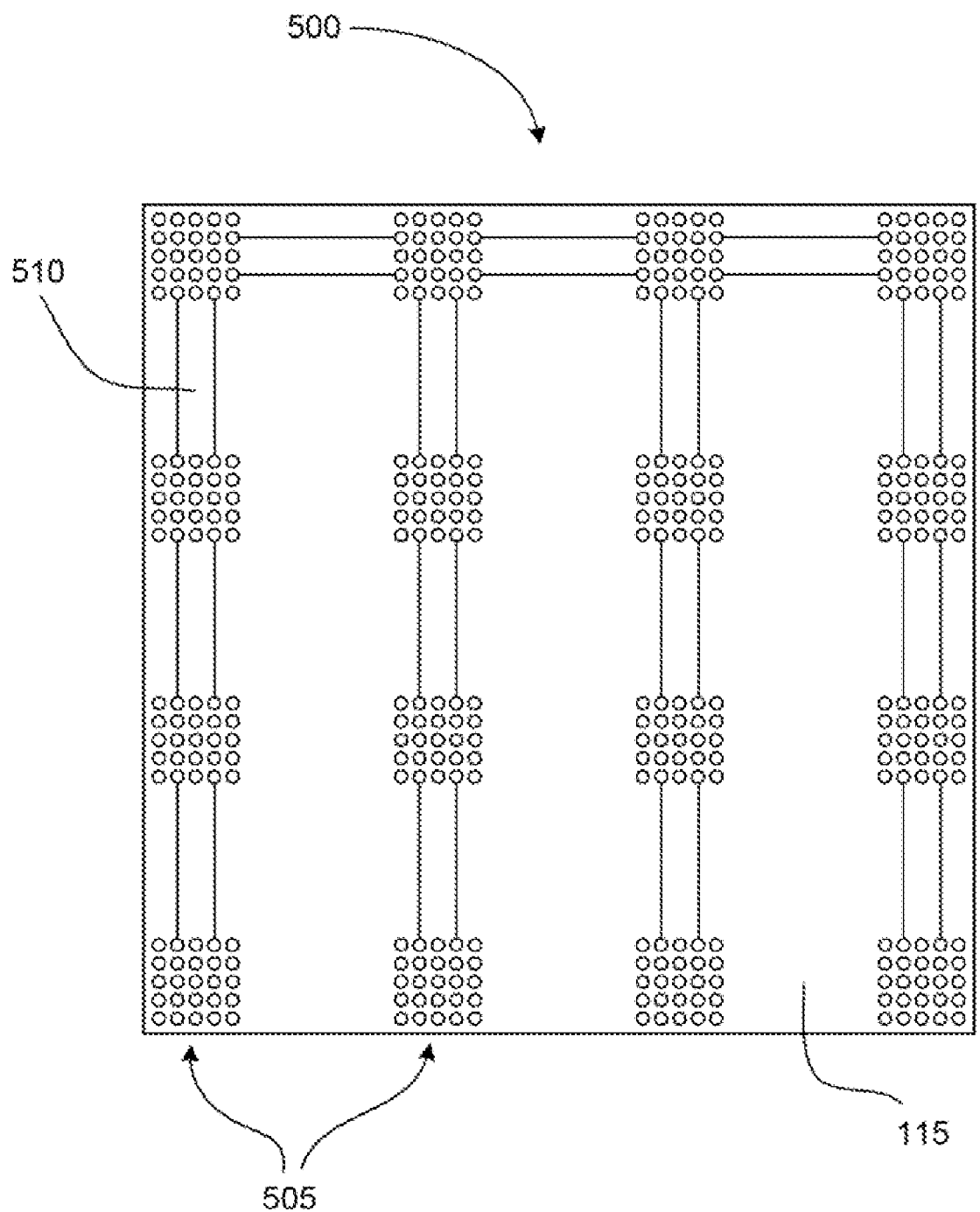
FIG. 5 is an orthogonal diagram of a plurality of exemplary arrays of electrically conductive nanowires, according to an embodiment of the principles described herein.

A contact (500), one side of an electrical connection, may include several individual arrays (505) of electrically conductive nanowires, as is shown in the illustrative embodiment of FIG. 5. The surface (115) of the contact (500) may have as much surface area as needed to fit the arrays (505) on the surface (115). The plurality of arrays (505) of nanowires may be spaced apart across the surface (115) of the contact (500). Electrically conductive lines (510) may connect each of the arrays (505) of nanowires with each other if the surface (115) on which they are placed does not have desired electrically conductive properties.

The plurality of arrays (505) of nanowires may be matched by a corresponding number of nanowire arrays on the opposite contact of the electrical connection. A number of arrays (505) provides a higher contact surface area. Therefore, the contact (500) has a lower contact resistance.

One or more of the arrays (505) may alternatively be electrically isolated from the other arrays (505) such that it carries an individual electrical signal different than that of the other arrays. Also, a plurality of arrays (505) of nanowires spaced apart across a surface (115) of an electrical contact (500) may provide structural stability for the electrical interconnect between two electrical contacts.

Figure 6:
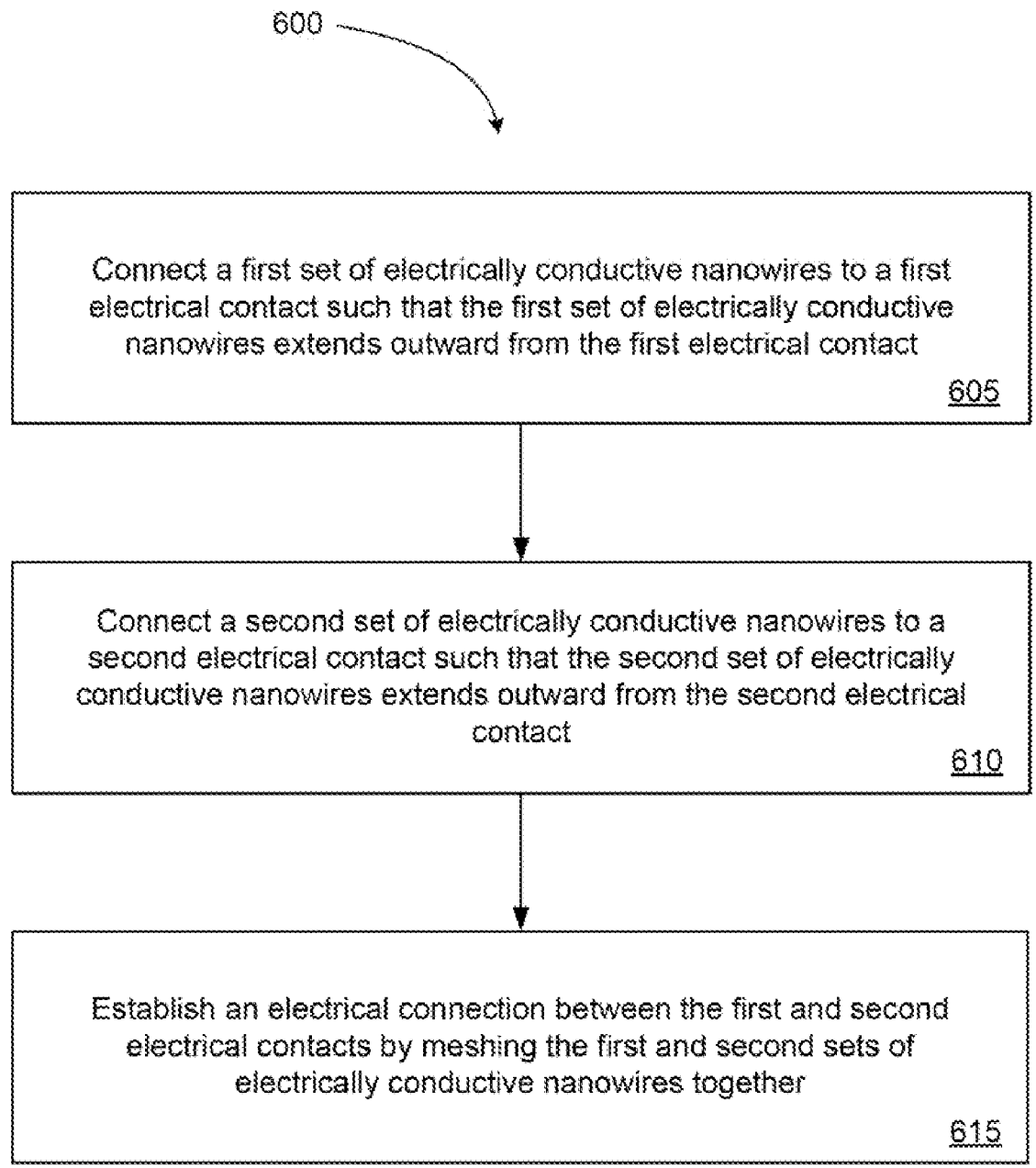
FIG. 6 is a flowchart diagram of an exemplary method for interconnecting electrical contacts, according to an embodiment of the principles described herein.

FIG. 6 is a flowchart (600) of a method for interconnecting electrical contacts which includes: connecting (605) a first array of electrically conductive nanowires to a first electrical contact such that the first array of electrically conductive nanowires extends outward from the first electrical contact; connecting (610) a second array of electrically conductive nanowires to a second electrical contact such that the second array of electrically conductive nanowires extends outward from the second electrical contact. In some embodiments, the first and second arrays of nanowires are formed to extend parallel to a normal of a surface of each of the first and second electrical contacts, respectively.

After fabricating the first and second arrays of nanowires in the first and second electrical contacts, the method includes establishing (615) an electrical connection between the first and second electrical contacts by meshing the first and second arrays of electrically conductive nanowires together. The meshed wires are able to hold the first and second electrical contacts together so that the electrical connection is constant and uninterrupted. The meshed nanowires also provide a large area of contact for electrical communication between the first and second electrical contacts. Therefore, the contact resistance between the first and second electrical contacts is reduced, allowing for better electrical communication.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An electrical interconnect, comprising:
   first and second electrical contacts to be electrically connected, each electrical contact comprising a plurality of electrically conductive nanowires extending outwardly from a respective electrical contact; and
   said nanowires of said first electrical contact configured to contact with said nanowires of said second electrical contact such that an electrical connection is established between said first electrical contact and said second electrical contact;
   wherein said nanowires of said first and second electrical contacts comprise different materials such that contact between nanowires of said first and second electrical contacts is contact between two different materials.

2. The electrical interconnect of claim 1, wherein at least some of said nanowires are coated with an electrically conductive material.

3. The electrical interconnect of claim 1, wherein at least some of said nanowires comprise a semiconductor material.

4. The electrical interconnect of claim 1, wherein at least some of said nanowires comprise a metal.

5. The electrical interconnect of claim 1, wherein at least some of said nanowires comprise silicide.

6. The electrical interconnect of claim 1, wherein each of said electrical contacts comprise two or more separated groups of said nanowires.

7. The electrical interconnect of claim 1, wherein at least some of said nanowires are nanotubes.

8. The electrical interconnect of claim 1, wherein at least some of said nanowires comprise a varied thickness.

9. The electrical interconnect of claim 8, wherein said nanowires of varied thickness taper from a largest thickness at a surface of said electrical contact to a smallest thickness at a distal end of each said nanowire.

10. The electrical interconnect of claim 1, wherein said nanowires project perpendicularly from said first and second contact surfaces.

11. The electrical interconnect of claim 1, wherein said nanowires of said first contact surface have a different thickness than said nanowires of said second contact surface.

12. The electrical interconnect of claim 1, in which said second electrical contact comprises indentations for receiving tips of said nanowires extending from said first electrical contact.

13. The electrical interconnect of claim 12, in which said indentations comprise a conductive material deposited therein.

14. The electrical interconnect of claim 1, in which said nanowires are randomly spaced on said first and second electrical contacts.

15. The electrical interconnect of claim 1, in which at least one of said electrical contacts and said nanowires extending from that contact surface are made of a same material.

16. An electrical interconnect, comprising:
    a plurality of contact surfaces to be electrically connected, each contact surface comprising a plurality of electrically conductive nanowires extending outwardly from said contact surface at random orientations relative to each other; and
    said nanowires of a first said plurality of contact surfaces configured to mesh with said nanowires of a second said plurality of contact surfaces such that an electrical connection is established between said first contact surface and said second contact surface.

17. The electrical interconnect of claim 16, wherein said nanowires of said first electrical contact surface comprise a different material than said nanowires of said second electrical contact surface, wherein said nanowires of said first and second electrical contact surfaces comprise different materials such that contact between nanowires of said first and second electrical contacts is contact between two different materials.

18. The electrical interconnect of claim 16, wherein said first contact surface comprises inset portions configured to receive and stabilize tips of said nanowires of said second contact surface.

19. The electrical interconnect of claim 16, in which at least one of said first and second contact surfaces and said nanowires extending from that contact surface are made of a same material.

20. A method for interconnecting electrical contacts, comprising meshing a first array of electrically conductive nanowires extending from a first electrical contact with a second array of electrically conductive nanowires extending from a second electrical contact so as to establish an electrical connection between said first and second electrical contacts; and magnetically coupling said first electrical contact with said second electrical contact.

* * * * *